United States Patent [19]
Olsson et al.

[11] Patent Number: 4,781,603
[45] Date of Patent: Nov. 1, 1988

[54] GROUNDING SYSTEM FOR A CABINET

[75] Inventors: Rolf T. Olsson, Tullinge; Hans O. W. Andersson, Sollentuna, both of Sweden

[73] Assignee: Telefonaktiebolaget LM Ericsson, Stockholm, Sweden

[21] Appl. No.: 30,863

[22] PCT Filed: May 16, 1986

[86] PCT No.: PCT/SE86/00231

§ 371 Date: Jan. 30, 1987

§ 102(e) Date: Jan. 30, 1987

[87] PCT Pub. No.: WO86/07497

PCT Pub. Date: Dec. 18, 1986

[30] Foreign Application Priority Data

Jun. 14, 1985 [SE] Sweden ............... 8502976

[51] Int. Cl.[4] ........................ H01R 13/648
[52] U.S. Cl. ........................ 439/95; 439/607
[58] Field of Search ............... 439/92, 94–96, 439/607, 827; 174/35 GC; 361/390

[56] References Cited

U.S. PATENT DOCUMENTS

| 2,756,369 | 7/1952 | Gorrie | 361/390 |
| 3,885,084 | 5/1975 | Kaiserswerth et al. | 174/35 GC |
| 3,889,043 | 6/1975 | Jean Ducros | 174/35 GC |
| 3,904,810 | 9/1975 | Kraus | 174/35 C |
| 4,082,410 | 4/1978 | Storck et al. | 439/827 |
| 4,572,921 | 2/1986 | May et al. | 174/35 GC |
| 4,593,961 | 6/1986 | Cosmo | 439/66 |

Primary Examiner—J. Patrick McQuade
Attorney, Agent, or Firm—Roberts, Spiecens & Cohen

[57] ABSTRACT

A grounding system for cabinets containing electronic equipment is made up from vertical bars (2), horizontal bars (3) and connection bars (11) between the horizontal bars, all the bars being made of aluminum. At the connection points between the bars there are mounted contact-making, spring-biased contact plates (4). The contact plate (4) is rectangular and provided with contact tongues (6) arranged in rows projecting from, both faces of the plate.

10 Claims, 2 Drawing Sheets

GROUNDING SYSTEM FOR A CABINET

FIELD OF THE INVENTION

The invention relates to a grounding system for cabinets containing electrical equipment and particularly to cabinets containing bars of soft metal such as aluminum for carrying off ground currents.

BACKGROUND

When electronic equipment is placed in cabinets, there is the requirement that ground currents, which can be considerable, shall be led off with a rise in potential which is so small that the sensitive electronic equipment is not damaged. One kind of ground connection used so far, comprises conductors with cable shoes placed between the apparatus and their stands, the shoes being screwed to the apparatus and to the stand. Another kind of ground connection comprises a serrated washer placed between the apparatus casing and the plates of the stand. A fastening screw which fastens the apparatus to the stand passes through this serrated washer. An example of such a contact means is described in SE-C-7509869 9(387201).

SUMMARY OF THE INVENTION

The invention is directed to a further development of the above mentioned serrated washer. The invention is characterized by a construction in which first and second bars of a yielding soft material, such as aluminum serve for leading off ground currents, the bars being attachable to a cabinet adapted for containing electrical equipment in an arrangement in which the first and second bars overlap one another, and a contact-making spring-biased contact plate is disposed between the bars at the locations where the bars overlap one another. The contact plate has a plurality of spaced contact points at which contact is made between the contact plate and the bars, the contact plate being inserted in an opening in a second plate disposed between the bars to maintain the contact between the contact plate and said bars at discrete locations constituted by said spaced contact points.

In the grounding system, the bars which are connected to each other, and together thus have conductive capacity which is so great that occuring ground currents are led away with only a resulting small rise in potential, and the spring-biased contact plates at the junction points between the bars give a continous, low transfer resistance between them, although the material of the bars is of soft metal, in this case aluminum, which yields somewhat to compression stress.

The horizontal bars in side-by-side cabinets are united by connection bars of aluminum with the aid of the same spring-biased contact plate which unites the bars in the cabinet.

BRIEF DESCRIPTION OF THE FIGURES OF THE DRAWINGS

An example of a grounding system in accordance with the invention is described in the following with reference to the accompanying drawings, wherein.

DETAILED DESCRIPTION OF A PREFERRED EMBODIMENT OF INVENTION

Figure 1:
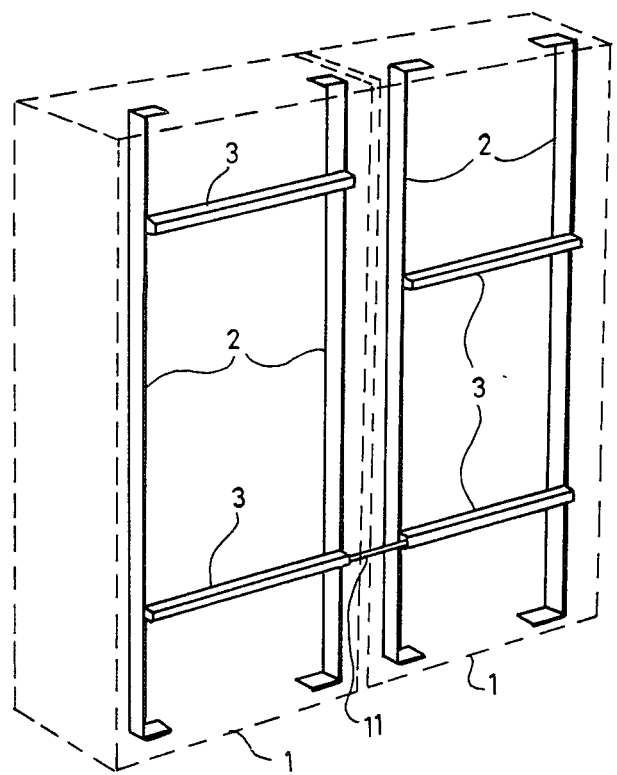
FIG. 1 diagrammatically illustrates two cabinets with bars.

Two cabinets 1 are illustrated as an example in FIG. 1, each containing two vertical bars 2 and two horizontal bars 3. Each vertical bar 2 is bent towards at right angles at each end, and in each cabinet there is an unillustrated connection terminal arranged on one of the bent-in parts for the connection of a ground conductor. Any of the four bent-in parts may be used for connecting the ground conductor.

Figure 2:
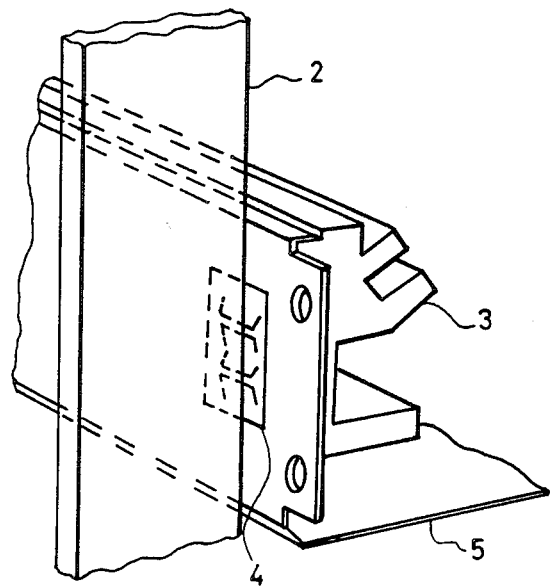
FIG. 2 illustrates a junction point between a vertical and horizontal bar

A contact plate 4 is disposed, as illustrated in FIG. 2, at an intersection point between one of the vertical bars 2, and one of the horizontal bars 3. The vertical bar 2 has a rectangular cross section and is attached to the side wall of the cabinet by fastening screws (not shown), while the horizontal bar 3, which is carried by a surrounding plate 5, is fastened to the cabinet with other fastening screws and pressed against the narrow edge of the vertical bar.

Figures 3, 4:
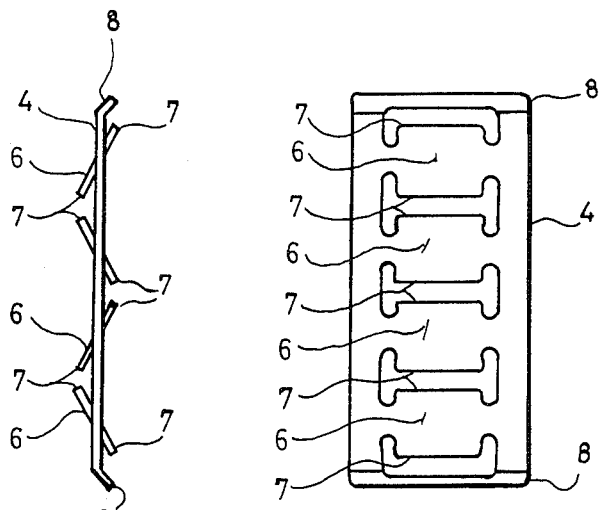
FIGS. 3 and 4 illustrate a spring-biased contact plate in side view and elevation view respectively.

As illustrated in FIGS. 3 and 4, the contact plate 4 has a rectangular shape, punched out from sheet metal, and is provided with a plurality of contact tongues, four in the illustrated example, which are punched out in a row along the center line of the plate and alternatingly bent out of the plane of the plate so that there is formed a total of eight contact-making edges 7. The edges 7 are right-angular and sharp to give good electrical contact with the bars.

A small part of the ends 8 of the contact plate is somewhat bent out from one face of the plate to form retaining flanges.

The material of the contact plate 4 is tin bronze and is tinned, whereby the plate will give durable electrical contact against the aluminum bars without any danger of corrosion. Alternatively, the contact plate may be made from some other similar material, e.g. beryllium copper.

Figure 5:
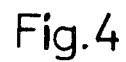
FIG. 5 illustrates a contact plate inserted at an intersection point between bars.

As previously mentioned, and as will be more clearly perceived from FIG. 5, the contact plate 4 is inserted in an opening in the plate 5 and is there pressed between the vertical bar 2 and the horizontal bar 3. The retaining flanges 8 of the contact plate are urged against the edges in the opening of the plate 5 so that the contact plate will be prevented from falling out during assembly, and the contact tongues 6 are bent such that the width of the contact plate measured between the edges 7 is greater than the space between both bars, such that the contact edges will engage against the bars with a continuous pressure after insertion. Since the contact plate 4 is disposed in the plate 5 the contact tongues 6 are prevented from being completely pressed together.

Figure 6:
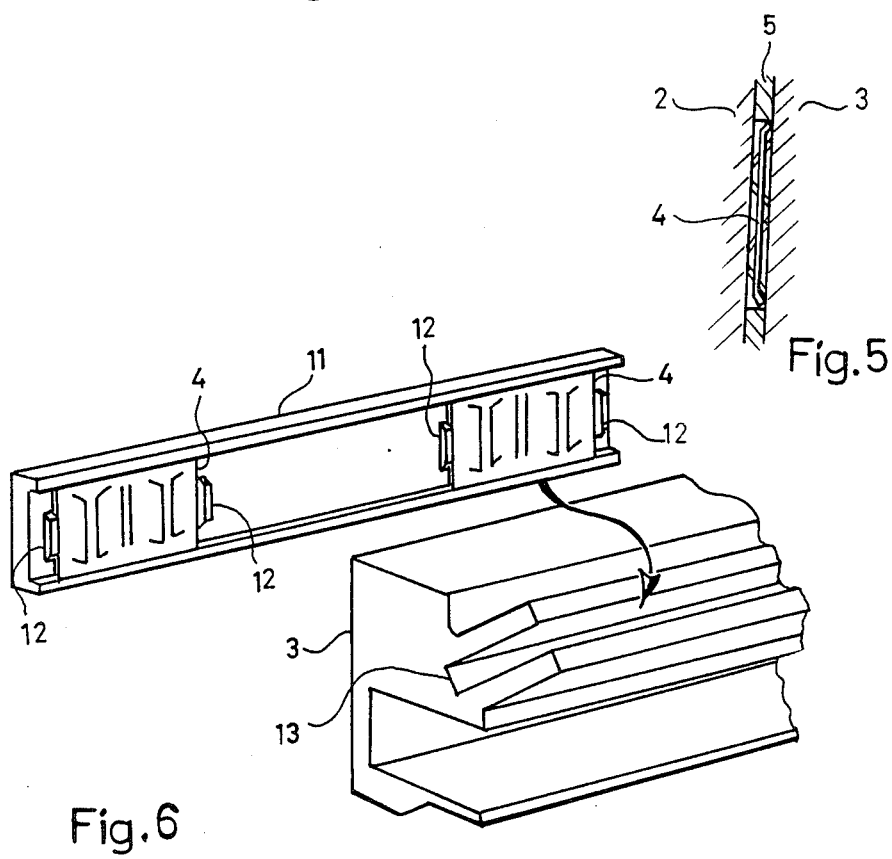
FIG. 6 is an exploded view which illustrates a connection bar between horizontal bars.

In the grounding system of the invention, there is further included, as will be seen from FIGS. 1 and 6, a connection bar 11 for connecting the horizontal bars 3 in side-by-side cabinets. As for the other bars, the material of the connection bar 11 is aluminum and its cross section is substantially rectangular with two flanges at the edges of the bar, so that its cross section has the form of a shallow U. At the ends of the connection bar, two spaced nodules 12 are pressed into the bar along its center line. The nodules and the flanges of the bar are adapted to retain one contact plate 4 at either end of the bar 11.

The horizontal bar 3 is provided with a longitudinal groove 13 with a width and depth suited to the reception of the connection bar 11 with its accompanying plate 4 in the manner illustrated by a curved arrow in FIG. 6. The thickness of the horizontal bar 3 is adjusted in relation to the width of the groove 13 so that the contact tongues on the contact plate 4 are prevented from being completely pressed together.

To enable mounting the connection bar 11, the cabinet 1 is provided with a plurality of openings (not shown) at different heights in the side walls of the cabinets.

The horizontal bars 3 and indirectly the vertical bars 2 also, in two or more cabinets are electrically connected to each other with one or more connection bars 11, whereby any ground currents are effectively distributed in the bars and are led away to the ground conductors connected to each cabinet, so that potential rises are limited to a value which is not dangerous.

Electronic placed in the apparatus cabinet 1 are each provided with a ground conductor intended for connection to one of the horizontal bars 3, preferably with a connection means of the kind described in SE-C-7509890-5 (387480) and which is intended for attachment by a screw engaged in the groove 13 of the horizntal bar.

What is claimed is:

1. A grounding system for cabinets containing electrical equipment comprising first and second bars of a yielding, soft metal for leading off ground currents, said bars being attachable to a cabinet adapted for containing electrical equipment in an arrangement in which the first and second bars overlap one another and a contact-making, spring-biased contact plate between the bars at the location where the bars overlap one another, said contact plate having a plurality of spaced contact points at which contact is made between the contact plate and said bars, the contact plate being inserted in an opening in a second plate disposed between the bars to maintain the contact between the contact plate and said bars at discrete locations constituted by said spaced contact points.

2. A grounding system as claimed in claim 1 wherein said contact plate comprises a flat plate element having contact tongues arranged in a row and projecting from both sides of the contact plate.

3. A grounding system as claimed in claim 2 wherein said contact tongues are bent outwards from the contact plate in alternating opposite directions.

4. A grounding system as claimed in claim 3 wherein each tongue has opposite ends respectively forming said contact points.

5. A grounding system as claimed in claim 4 wherein said contact plate element has opposite ends and portions at said ends bent out from the plane of the contact plate to form retaining flanges.

6. A grounding system as claimed in claim 5 wherein said contact plate is made of tin bronze.

7. A grounding system as claimed in claim 5 wherein said first and second bars are respectively arranged horizontally and vertically, said system further comprising an aluminum bar for connecting the horizontal bars of adjacent cabinets together and a further said contact plate between the aluminum bar and each of the horizontal bars of the adjacent cabinets.

8. A grounding system as claimed in claim 7 wherein each horizontal bar has a groove for receiving said aluminum bar together with the further contact plate.

9. A grounding system as claimed in claim 8 wherein said aluminum bar has flanges between which said further contact plate is retained.

10. A grounding system as claimed in claim 1 wherein said first and second bars are respectively arranged horizontally and vertically, said system further comprising an aluminum bar for connecting the horizontal bars of adjacent cabinets together and a further said contact plate between the aluminum bar and each of the horizontal bars of the adjacent cabinets.

* * * * *